United States Patent [19]

Slutz et al.

[11] Patent Number: 5,286,524
[45] Date of Patent: Feb. 15, 1994

[54] METHOD FOR PRODUCING CVD DIAMOND FILM SUBSTANTIALLY FREE OF THERMAL STRESS-INDUCED CRACKS

[75] Inventors: David E. Slutz, Columbus; Friedel S. Knemeyer, Granville, both of Ohio

[73] Assignee: General Electric Company, Worthington, Ohio

[21] Appl. No.: 806,393

[22] Filed: Dec. 13, 1991

[51] Int. Cl.$^5$ .............................................. B05D 5/00
[52] U.S. Cl. .................................. 427/249; 427/255.2; 156/655
[58] Field of Search ..................... 156/643, 345, 655; 118/723; 427/249, 255.1, 255.2, 255.7

[56] References Cited

U.S. PATENT DOCUMENTS

| | | | |
|---|---|---|---|
| 4,707,384 | 11/1987 | Schachner et al. | 427/255.2 X |
| 4,941,942 | 7/1990 | Bruns et al. | 427/249 X |
| 5,114,745 | 5/1992 | Jones | 427/249 X |
| 5,124,179 | 6/1992 | Garg et al. | 427/249 X |

Primary Examiner—Thi Dang

[57] ABSTRACT

Chemical vapor deposition method for producing a diamond film substantially free of thermal stress-induced cracks in which diamond growth occurs on both sides of a thin substrate so that two diamond coatings with identical opposing tensile forces are formed on each side of the substrate at a thickness greater than the thickness of the thin substrate.

10 Claims, No Drawings

METHOD FOR PRODUCING CVD DIAMOND FILM SUBSTANTIALLY FREE OF THERMAL STRESS-INDUCED CRACKS

The present invention relates to chemical vapor deposition of diamond and, more particularly, to an improved method of preparing diamond film substantially free of thermal stress-induced cracks or fragmentation.

BACKGROUND OF THE INVENTION

The diamond form of carbon possesses many desirable physical properties such as hardness, chemical inertness, infrared transparency, and excellent heat conductivity coupled with very high electrical resistivity. Consequently, diamond is a material with many important technological applications such as in optical devices, semiconductors, heat sinks, abrasives, tool coating, etc. It can also be used as a high-grade, radiation-resistant, high-temperature semiconductor with obvious applications in many technologies. Thus, there is considerable incentive to find practical ways to synthesize diamond, especially in film form, for these many and varied applications.

Various methods are known for the synthetic production of diamond, including diamond in film form. In particular, the deposition of diamond coatings on substrates to provide films is known.

One class of the methods developed for synthetic diamond deposition is the low pressure growth of diamond called the chemical vapor deposition (CVD) method. Three predominant CVD techniques have found favor in the literature.

One of these techniques involves the use of a dilute mixture of hydrocarbon gas (typically methane) and hydrogen, wherein the hydrocarbon content usually is varied from about 0.1% to 2.5% of the total volumetric flow. The gas is introduced via a quartz tube located just above a hot tungsten filament which is electrically heated to a temperature ranging from between about 1750° C. to 2400° C. The gas mixture disassociates at the filament surface, and diamonds are condensed onto a heated substrate placed just below the hot tungsten filament. The substrate is heated to a temperature in the region of about 500° C. to 1100° C.

The second technique involves the imposition of a plasma discharge to the foregoing filament process. The plasma discharge serves to increase the nucleation density and growth rate, and it is believed to enhance formation of diamond films as opposed to discrete diamond particles. Of the plasma systems that have been utilized in this area, there are three basic systems: One is a microwave plasma system, the second is an RF (inductively or capacitively coupled) plasma system, and the third is a d.c. plasma system. The RF and microwave plasma systems utilize relatively complex and expensive equipment which usually requires complex tuning or matching networks to electrically couple electrical energy to the generated plasma. Additionally, the diamond growth rate offered by these two systems can be quite modest.

A third method in use is direct deposit from acetylene as a hydrocarbon-rich oxyacetylene flame. In this technique, conducted at atmospheric pressure, a specific part of the flame is played on a substrate on which diamond grows at rates as high as 100 microns/hour or more. See Y. Matsui et al., *Japan Journal of Applied Physics*, 101, 28, p. 178 (1989).

In general, processes for the chemical vapor deposition of diamond involve selection of operating parameters such as the selection of a precursor gas and diluent gases, the mixture proportions of the gases, gas temperature and pressure, the substrate temperature, and means of gas activation. These parameters are adjusted to provide diamond nucleation and growth on a substrate. Mixture proportions and conditions must provide atomic hydrogen to stabilize the surface of the diamond film and preferably minimize the deposition of graphite. Codeposition of graphite is more evident if the hydrocarbon (methane) concentration is increased above about 3%.

The CVD techniques provide diamond films grown in tension. The tensile stress can cause the film to crack or peel from the substrate during growth because of the thermal gradient through the substrate or during cooldown, as a result of differences in the coefficients of thermal expansion between the diamond and the substrate material. Thus, for example, where molybdenum substrates are often used, the thermal gradient through the substrate can cause the substrate to bow due to the thermal expansion difference between the hot and cold sides. In addition, the coefficients of thermal expansion of diamond and molybdenum are so different that compressive stress is induced in the diamond coating as the coated molybdenum is cooled from the temperature at which diamond deposition takes place.

The diamond film grows in tension due to defects, and the inherent tensile stress/intrinsic strain is proportional to the film thickness and the rate of diamond deposition. This compressive stress and the inherent tensile stress in diamond is at first accommodated by elastic strain in the diamond. This elastic strain energy is released when the diamond is separated from the substrate. If the stored elastic strain energy is much greater than the interface surface energy, the separation will start simultaneously at many places on the diamond substrate interface, and a large number of small pieces of diamond will be obtained in the catastrophic separation. Thin diamond coatings can usually withstand such stress, but thick coatings may cause partial separation of the diamond layer from the molybdenum substrate and/or catastrophic failure of the diamond layer in the form of severe cracking and fragmentation.

It is well known that CVD diamond tends to nucleate on certain substrate materials more readily than others and that good bonding to the substrate is necessary during the growth period, particularly when growing thick films, to avoid catastrophic release of the film as a result of the intrinsic strain therein. However, the diamond film can be so strongly attached to the substrate that at the end of the growth period, where there is a significant differential in thermal expansion between the diamond and the substrate, the diamond film may crack during cool down. The use of release agents will promote the eventual removal of the film from the substrate but may cause the diamond to be so poorly bonded during growth that it causes a catastrophic release thereof from the substrate.

It is desirable to produce thick CVD diamond films which are easily removed from a substrate, do not release prematurely during deposition, and do not crack upon cool down.

OBJECTS OF THE INVENTION

It is an object of the present invention to provide an improved method for growing CVD diamond film on a thin substrate, wherein the formation of thermal stress-induced cracks in the resulting film is reduced.

Another object is to provide an improved method for growing CVD diamond film on a substrate which does not bow or distort during diamond growth and does not induce significant stress on the film upon cool down.

An additional object is to provide a novel substrate and apparatus for the deposition of diamond coatings.

A further object is to provide a composite which consists of two outer layers, each comprising a diamond film grown by CVD and a core layer, which is the substrate upon which the diamond is grown.

Upon further study of the specification and appended claims, further objects and advantages of this invention will become apparent to those skilled in the art.

SUMMARY OF THE INVENTION

The above objects are achieved through the present invention by a method for preparing crack-free diamond where CVD diamond coatings are grown on both sides of a thin substrate. The tensile stresses of the composite material will balance as the two diamond coatings grow. The thermal gradient of the substrate will be near zero. After the CVD diamond coatings have grown, the composite will behave as if the CVD diamond film is the bulk material, and the thin substrate is the film. An advantageous aspect of the invention is that the substrate will not induce significant stress on the CVD film on cool down; therefore, the likelihood of cracking is reduced.

In the process of this invention, diamond is deposited by exposing both sides of a thin substrate to heat and an excited reactive gas mixture under conditions such that the deposition of the diamond film occurs on both sides of the substrate, preferably at an identical rate so as to grow two coatings with identical opposing tensile forces on each side of said substrate. The substrate is of a thickness less than the diamond coatings formed thereon. When the substrate is separated from the coatings, self-supported diamond films are obtained which are typically free of cracks.

The present invention also achieves these objects by providing a thin substrate for the deposition of the diamond coatings by chemical vapor deposition, wherein both sides of the thin substrate are adapted to be exposed to heat and an excited reactive gas mixture so as to grow diamond coatings thereon which form self-supported diamond films when separated from the substrate.

This invention also provides an apparatus for the chemical vapor deposition of diamond on substrates comprising:

a closed reaction chamber which can maintain a reduced pressure having at least one gas inlet to provide a reactive gas mixture therein and at least one exhaust means;

a thin substrate, as described above, positioned within said chamber;

support means for maintaining said substrate rigid;

means for heating both sides of said substrate to substantially the same temperature;

means for exciting the reactive gas mixture therein; and means for contacting both sides of the substrate with the excited reactive gas mixture.

DETAILED DESCRIPTION OF THE PREFERRED EMBODIMENTS

One aspect of the invention is exposing both sides of a thin substrate to heat and an excited reactive gas mixture such that deposition of the CVD diamond film occurs on both sides of the substrate, preferably at a substantially identical rate. The resulting CVD diamond films exhibit fewer cracks and fragmentation during growth and upon cool down. The films are substantially free of cracks, i.e., there are no surface defects which fragment the film or render the film unsuitable for use as a heat sink.

Any conventional substrate material suitable for the deposition of CVD diamond thereon may be employed in the thin substrates utilized in the present invention. The substrate material may be selected from the class comprising silicon carbide, tungsten carbide, molybdenum, boron, boron nitride, niobium, graphite, copper, aluminum nitride, silver, iron, nickel, silicon, alumina, and silica, as well as combinations thereof. Molybdenum is a preferred substrate material because it generates a high density of diamond nuclei without having been roughened or subjected to abrasion with diamond dust.

Niobium is also a preferred hydride-forming substrate material because diamond films release easily from this metal. The thermal expansion coefficient of molybdenum, i.e., $\alpha = 5.1 \times 10^{-6}/°$ C., is relatively constant at temperatures above 152° C., its Debye temperature, and is higher than the thermal expansion coefficient of diamond, i.e. $\alpha = 1.5 \times 10^{-6}/°$ C. at 124° C. and $4.8 \times 10^{-6}/°$ C. at 930° C. The thermal expansion coefficient of diamond is rapidly changing in the temperature range of CVD diamond growth, since its Debye temperature is far above this temperature range. The thermal expansion coefficient of molybdenum is 30% larger than the average thermal expansion coefficient of diamond between the substrate deposition temperature and room temperature. Other substrate materials show similar differences in the coefficient values.

The process of the present invention reduces the catastrophic separation caused during growth of the substrate independently of the material used. By growing the diamond coating on both sides of the substrate, preferably at an identical rate, the tensile forces on both sides of the substrate from the diamond will counteract and preferably match each other. In addition, the thermal gradient through the substrate will be zero, thereby preventing the substrate from bowing during diamond growth due to differences in thermal expansion between the hot and cool sides. The effect is a flat, rigid substrate on which to grow the diamond.

By utilizing a thin substrate when the coatings are grown to the desired thickness, they are thicker than the substrate. The bulk properties of the three-layer composite (diamond/substrate/diamond) are that of diamond and not the substrate. On cool down, the substrate acts as a film and will not induce significant compressive stress on the diamond coatings from the thermal mismatch. This configuration will prevent the diamond film from distorting (bowing) and reduce cracking on cool down. The substrate can be removed from the diamond coatings by conventional methods such as acid leaching, providing self-supported diamond films. The substrate is of a thickness less than the diamond coatings formed thereon, typically less than either coating formed thereon. These substrates range in thickness from 0.005 to 0.1 inches and are typically about 0.01 inches in thickness. The thickness of the diamond films produced range from 100-2000 μm, preferably 150-1500 μm, and most preferably 500-1000 μm.

Conventional reactive gas mixtures and process conditions are suitable for use in the process of this invention. For example, conventional gaseous hydrogen and hydrocarbon mixtures are suitable. The hydrocarbon sources can include alkane series gases such as, for example, methane, ethane, and propane; unsaturated hydrocarbons, for example, ethylene, acetylene, cyclohexene, and benzene; and the like. Methane, however, is preferred. The molar ratio of hydrocarbon to hydrogen broadly ranges from about 1:10 to about 1:1000, with about 1:100 to 3:100 being preferred. The reactive gas mixture may optionally be diluted with an inert gas such as argon.

Pressures for the reactive gas mixture generally range from about 0.01 to 1000 Torr, advantageously about 1 to 760 Torr, and preferably about 10 Torr. Details on conventional process conditions suitable for use suitable for use herein can also be found in Angus et al., "Low Pressure Metastable Growth of Diamond and Diamond-Like Phases," Science, Vol. 241, pp. 913-921 (Aug. 19, 1988), and Bachman et al., "Thin Diamond Films," Chemical Engineering News, pp. 24-39 (May 15, 1989). U.S. Pat. No. 4,707,384 provides further details concerning CVD conditions and techniques.

The reactive gas mixture of hydrogen and a hydrocarbon, most often methane, is "energized" or excited utilizing conventional techniques, preferably by passing the reactive gas over a hot filament at a conventional temperature, preferably in the range of 1700°-2400° C. Once energized, the excited reactive gas mixture is contacted with both surfaces.

The thin substrate is heated to a conventional temperature. The substrate temperature utilized for diamond growth typically ranges from about 500°-1100° C. and is preferably in the range of 850°-950° C. on both surfaces. It is often desirable to maintain the substrate at temperatures in the range of about 900°-1000° C. since, within this range, minimum reaction occurs between the hydrogen present in the gas mixture and the elemental carbon formed from the hydrocarbon therein; thus, said elemental carbon remains available to deposit as diamond at a high growth rate on the substrate. Absent any provisions for independently controlling substrate temperature, said temperature frequently exceeds 1000° C., and the diamond growth rate decreases substantially. Growth rates in the range of about 0.1 to 10 μm per hour have been easily obtained at energy requirements of about 650 watts/hour. Growth rates greater than 10 μm/hour can be obtained at higher energy costs.

The thin substrate of this invention has a thickness in the range of 0.005 to 0.1 inches, typically about 0.01 inches. The surface area of the substrate can vary widely from 0.1 square inch to 2500 square inches, preferably from 1-10 square inches. Both sides of the thin substrate are adapted to be exposed to heat and an excited reactive gas mixture so as to grow diamond thereon. Each surface is preferably polished so as to allow easy removal of the diamond coatings formed thereon to provide self-supporting films. Suitable materials are those described above.

The apparatus of this invention is suitable for performing the process provided herein and utilizes a thin substrate as defined above. This apparatus comprises a reaction chamber which is air-tight and capable of being maintained under reduced pressure, preferably a vacuum. It is fitted with at least one inlet to provide a reactive gas mixture and exhaust means. All portions of the reaction chamber can be of a conventional design and construction. Quartz is illustrative of a suitable non-conductive, heat-resistant material.

A thin substrate of this invention is positioned in the reaction chamber and support means, such as a spring tension mechanism, maintains the substrate rigid.

The apparatus also comprises a heating means for heating both sides of the substrate which is preferably electrodes and vertically extending, linear, electrically conductive filaments or wires (hereinafter generically designated "filaments") of otherwise conventional design and circuitry. The material of which said filaments are comprised is not critical, any material known in the art as suitable for this purpose being acceptable. Illustrative materials are metallic tungsten, tantalum, molybdenum, and rhenium which can be heated to temperatures between 1700°-2400° C. Because of its relatively low cost and particular suitability, tungsten is often preferred. Filament diameters of about 0.007-0.39 inch are typical, with about 0.03 inch frequently being preferred.

The filaments are positioned on the opposing sides of and parallel to the substrate. Distances from filaments to substrate are generally on the order of about 0.400-0.600 inch. The filaments are preferably separated by about 0.600 inches from each other. A radiation shield, preferably about 3 inches in diameter, may be placed around the substrate/filament arrangement. Since a plurality of filaments, preferably about four, with two on each side, and associated structures are present, it should be understood that the total number thereof is not critical to the invention.

The apparatus also includes means for contacting both sides of the substrate with the excited reactive gas mixture. This may not require an additional structure or element if the substrate is positioned appropriately within the reaction chamber.

The composites of this invention consist of two outer layers which comprise diamond and a core layer which comprises a substrate upon which the diamond layers are grown. The composite is of a length and width consistent with conventional substrates, typically ranging from about 0.1 to 2500 square inches. The thickness of the diamond layers range from 1-2000 μm, preferably 150-1000 μm. The core layer (substrate) has a thickness of from 0.005 to 0.1 inches, typically about 0.01 inches.

Without further elaboration, it is believed that one skilled in the art can, using the preceding description, utilize the present invention to its fullest extent. The following preferred specific embodiments are, therefore, to be construed as merely illustrative and not limitative of the remainder of the disclosure in any way whatsoever.

In the foregoing and in the following example, all temperatures are set forth in degrees Celsius; and, unless otherwise indicated, all parts and percentages are by weight.

The entire disclosure of all applications, patents, and publications, cited above and below, are hereby incorporated by reference.

EXAMPLE

A CVD reactor, designed to accept the substrate described below, is used. The CVD reactor comprises a quartz reaction chamber, a gas inlet, and an exhaust outlet. The substrate is a 1"-wide strip of molybdenum of 0.010" thickness. The substrate is held in the reactor with a spring mechanism that keeps the substrate straight. The substrate is exposed to four 0.015 inch tungsten filaments. Two tungsten filaments are positioned at each opposing side at a distance of about 0.600 inch from the substrate. The two filaments on each side are separated by about 0.600 inch from each other. A radiation shield of about 3 inches in diameter is placed around the substrate/filament arrangement.

The chamber is evacuated and the filament heated to bright white heat (about 2000° C.) heating the substrate on both sides to a temperature of from 800°–1000° C. A reactive gas mixture containing about 1–2 wt % methane in hydrogen is introduced into the chamber at less than 0.1 bars. Passage of the gas mixture and heating of the substrate is continued for several days, growing diamond film on both sides of the substrate. At the end of this time, the methane flow is stopped, and the system is cooled down. A composite comprising two diamond coatings with a core layer of molybdenum substrate is removed. The thickness of each diamond coating is in the range of 0.015–0.020". The molybdenum substrate is removed by an acid etch to obtain two self-supported diamond films. The two diamond films recovered from the molybdenum substrate are free of cracks.

The preceding example can be repeated with similar success by substituting the generically or specifically described reactants and/or operating conditions of this invention for those used in the preceding examples.

From the foregoing description, one skilled in the art can easily ascertain the essential characteristics of this invention and, without departing from the spirit and scope thereof, can make various changes and modifications of the invention to adapt it to various usages and conditions.

What is claimed is:

1. A method for producing diamond film by chemical vapor deposition which comprises exposing both sides of a thin substrate to heat and an excited hydrogen and hydrocarbon gas mixture under conditions of temperature, pressure, and gas concentration which promote the growth of diamond coatings on both sides of said substrate, wherein the thickness of the substrate is in the range of 0.005–0.1 inches and is less than the diamond coatings grown thereon and separating the diamond coatings from the thin substrate to provide diamond films.

2. A method according to claim 1, wherein the growth rate of the diamond coatings on each side of the substrate is substantially identical and within the range of from 0.1 to 10 $\mu$m/hr.

3. A method according to claim 1, wherein the thin substrate is heated to provide surface temperatures on each side which are substantially identical and within the range of 500°–1100° C.

4. A method according to claim 1, wherein the diamond coatings are separated from the thin substrate by cooling the coated substrate to ambient temperature and etching the substrate away with acid.

5. A method as in claim 1, wherein the diamond films separated from the thin substrate have a thickness in the range of 100–2000 $\mu$m.

6. A method for producing diamond film by chemical vapor deposition which comprises exposing both sides of a thin substrate to heat and an excited hydrogen and hydrocarbon gas mixture under conditions of temperature, pressure, and gas concentration which promote the growth of diamond coatings on both sides of said substrate, wherein the thickness of the substrate is less than either of said diamond coatings grown thereon and has a surface area in the range of 0.1 to 2500 square inches and separating the diamond coatings from the thin substrate to provide diamond films.

7. A method according to claim 6, wherein the growth rate of the diamond coatings on each side of the substrate is substantially identical and within the range of from 0.1 to 10 $\mu$/hr.

8. A method according to claim 6, wherein the thin substrate is heated to provide surface temperatures on each side which are substantially identical and within the range of 500°–1000° C.

9. A method according to claim 6, wherein the diamond coatings are separated from the thin substrate by cooling the coated substrate to ambient temperature and etching the substrate away with acid.

10. A method according to claim 6, wherein the diamond films separated from the thin substrates have a thickness in the range of 100–2000 $\mu$m.

* * * * *